(12) United States Patent
Wei Hong et al.

(10) Patent No.: US 12,408,290 B2
(45) Date of Patent: Sep. 2, 2025

(54) THERMAL MANAGEMENT IN DATA STORAGE DEVICE

(71) Applicant: Sandisk Technologies, Inc., Milpitas, CA (US)

(72) Inventors: Tew Wei Hong, Simpang Ampat (MY); Chan Tze Ping, Jawi (MY); Lau Chun Sean, Bayan Lepas (MY); Heng JunJeen, Hutan Melintang (MY); Tan Yi Chun, Bayan Lepas (MY); Wong Guohonn, Bayan Lepas (MY)

(73) Assignee: Sandisk Technologies, Inc., Milpitas, CA (US)

( * ) Notice: Subject to any disclaimer, the term of this patent is extended or adjusted under 35 U.S.C. 154(b) by 263 days.

(21) Appl. No.: 18/448,656

(22) Filed: Aug. 11, 2023

(65) Prior Publication Data

US 2024/0324136 A1    Sep. 26, 2024

Related U.S. Application Data

(60) Provisional application No. 63/491,768, filed on Mar. 23, 2023.

(51) Int. Cl.
*H05K 7/20* (2006.01)
*H05K 1/02* (2006.01)

(52) U.S. Cl.
CPC ....... *H05K 7/20145* (2013.01); *H05K 1/0203* (2013.01); *H05K 7/20727* (2013.01);
(Continued)

(58) Field of Classification Search
CPC . G06F 1/20; G06F 1/185; G06F 1/181; G06F 2200/201; H05K 5/0213; H05K 1/0203; H05K 5/0269; H05K 7/20145; H05K 5/0047; H05K 7/20136; H05K 5/0217; H05K 5/04; H05K 7/20; G11B 33/142; H01L 2023/405
(Continued)

(56) References Cited

U.S. PATENT DOCUMENTS

| 7,251,139 B2* | 7/2007 | Bhattacharya ..... H05K 7/20009 361/720 |
| 2008/0089020 A1* | 4/2008 | Hiew ................... H05K 9/0067 361/825 |

(Continued)

*Primary Examiner* — Mandeep S Buttar
(74) *Attorney, Agent, or Firm* — Michael Best & Friedrich LLP

(57) ABSTRACT

Thermal management of data storage devices in a server. In one example, a data storage device with a housing includes a first section, a second section, a third section, at least one first aperture that defines an airflow inlet, and at least one second aperture that defines an airflow outlet. A printed circuit board assembly ("PCBA") disposed in the housing includes passive components arranged in a first area corresponding to the second section and active components arranged a second area and a third area corresponding to the first section and the third section, respectively. The airflow inlet and the airflow outlet direct airflow through an airflow channel in the second section of the housing. The airflow channel has a first cross-sectional area between the PCBA and the second section of the housing that is larger than a second cross-sectional area between the PCBA and the first section of the housing.

20 Claims, 6 Drawing Sheets

(52) U.S. Cl.
CPC .............. *H05K 2201/064* (2013.01); *H05K 2201/10545* (2013.01)

(58) Field of Classification Search
USPC .................................... 361/679.46
See application file for complete search history.

(56) References Cited

U.S. PATENT DOCUMENTS

| | | | | |
|---|---|---|---|---|
| 2014/0036435 | A1* | 2/2014 | Kim | G06F 1/20 361/679.33 |
| 2015/0355686 | A1* | 12/2015 | Heyd | G11B 33/128 361/679.31 |
| 2016/0324032 | A1* | 11/2016 | Davis | G11B 33/142 |
| 2018/0338387 | A1* | 11/2018 | Park | G02B 6/4284 |
| 2021/0133139 | A1* | 5/2021 | Hipes | G06F 3/0626 |
| 2023/0217624 | A1* | 7/2023 | Cao | H05K 7/20172 361/695 |
| 2024/0114660 | A1* | 4/2024 | Yarragunta | H05K 5/0213 |

* cited by examiner

THERMAL MANAGEMENT IN DATA STORAGE DEVICE

CROSS-REFERENCE TO RELATED APPLICATION

This application claims priority to and the benefit of U.S. Provisional Patent Application No. 63/491,768, filed on Mar. 23, 2023, the entire contents of which is incorporated herein by reference.

FIELD

This application relates generally to server thermal management, and more specifically, the application relates to thermal management within data storage devices.

SUMMARY

Information management systems ("IMS") or servers for enterprise generally consist of a chassis system with multiple slots to accept data storage devices, such as solid-state drives ("SSDs"). Solid-state drives include a printed circuit board assembly ("PCBA") populated with active and passive components. As the number of components on the PCBAs increases, efficiency of heat dissipation within the SSD decreases. Additionally, active components often have differing heights and orientations, which causes turbulence in air flow through the SSD. Air flow produced by cooling fans in a server may not be able to flow through the SSD, thus forming an "inert" interior medium and further reducing efficiency of heat dissipation. These problems are typically addressed by replacing the thermal interface material of the PCBA with a thermal interface material having a higher conductivity grade, resulting in higher production costs. Additionally, applying thermal interface material onto active components will close free air gaps between the components and the housing, resulting in more air turbulence. Alternatively, the number of active components on a PCBA may be reduced, reducing performance of the SSD.

Thus, the disclosure provides a data storage device including a housing and a printed circuit board assembly ("PCBA") disposed in the housing. The housing includes a first section, a second section, a third section, at least one first aperture that defines an airflow inlet, and at least one second aperture that defines an airflow outlet. The PCBA includes a plurality of passive components arranged in a first area corresponding to the second section and a plurality of active components arranged a second area and a third area corresponding to the first section and the third section, respectively. The airflow inlet and the airflow outlet direct airflow through an airflow channel in the second section of the housing. The airflow channel has a first cross-sectional area between the PCBA and the second section of the housing and a second cross-sectional area between the PCBA and the first section of the housing, the first cross-sectional area is larger than the second cross-sectional area.

Another embodiment provides a data storage device including a housing and a PCBA disposed in the housing. The housing including a first section, a second section, a third section, a first aperture that defines an angled airflow inlet, and a second aperture that defines an angled airflow outlet. The first aperture is positioned between the first section and the second section, and the second aperture is positioned between the second section and the third section. The angled airflow inlet and the angled airflow outlet are configured to direct airflow through the second section of the housing. The PCBA includes a plurality of active components arranged in a first area corresponding to the second section and a plurality of passive components arranged in a second area and a third area corresponding to the first section and the third section, respectively. A second airflow inlet and a second airflow outlet are together configured to direct airflow through an airflow channel in the first section and third section of the housing. Each of the plurality of passive components are arranged adjacent to the airflow channel.

Another embodiment provides a data storage device including a housing and a PCBA disposed in the housing. The housing includes a first section, a second section, a third section, at least one first aperture that defines an angled airflow inlet, and at least one second aperture that defines an angled airflow outlet. The PCBA includes a plurality of active components arranged in a first area corresponding to the second section and a plurality of passive components arranged a second area and a third area corresponding to the first section and the third section, respectively. The angled airflow inlet and the angled airflow outlet direct airflow through the second section of the housing. A first cross-sectional area between the PCBA and the first section is larger than a second cross-sectional area between the PCBA and the second section.

Various aspects of the present disclosure provide for improvements in data storage devices, for example, improving thermal management in a server. The present disclosure can be embodied in various forms, including hardware or circuits and their placement on a PCBA. The foregoing summary is intended solely to give a general idea of various aspects of the present disclosure and does not limit the scope of the present disclosure in any way.

DETAILED DESCRIPTION

In the following description, numerous details are set forth, such as data storage device configurations, and the like, in order to provide an understanding of one or more aspects of the present disclosure. It will be readily apparent to one skilled in the art that these specific details are merely exemplary and not intended to limit the scope of this application. The following description is intended solely to give a general idea of various aspects of the present disclosure and does not limit the scope of the disclosure in any way. Furthermore, it will be apparent to those of skill in the art that, although the present disclosure refers to NAND flash, the concepts discussed herein are applicable to other types of solid-state memory, such as NOR, PCM ("Phase Change Memory"), ReRAM, etc.

Terms of approximation, such as "generally," "approximately," or "substantially," include values within five percent greater or less than the stated value. When used in the context of an angle or direction, such terms include within one degree greater or less than the stated angle or direction.

Figure 1:
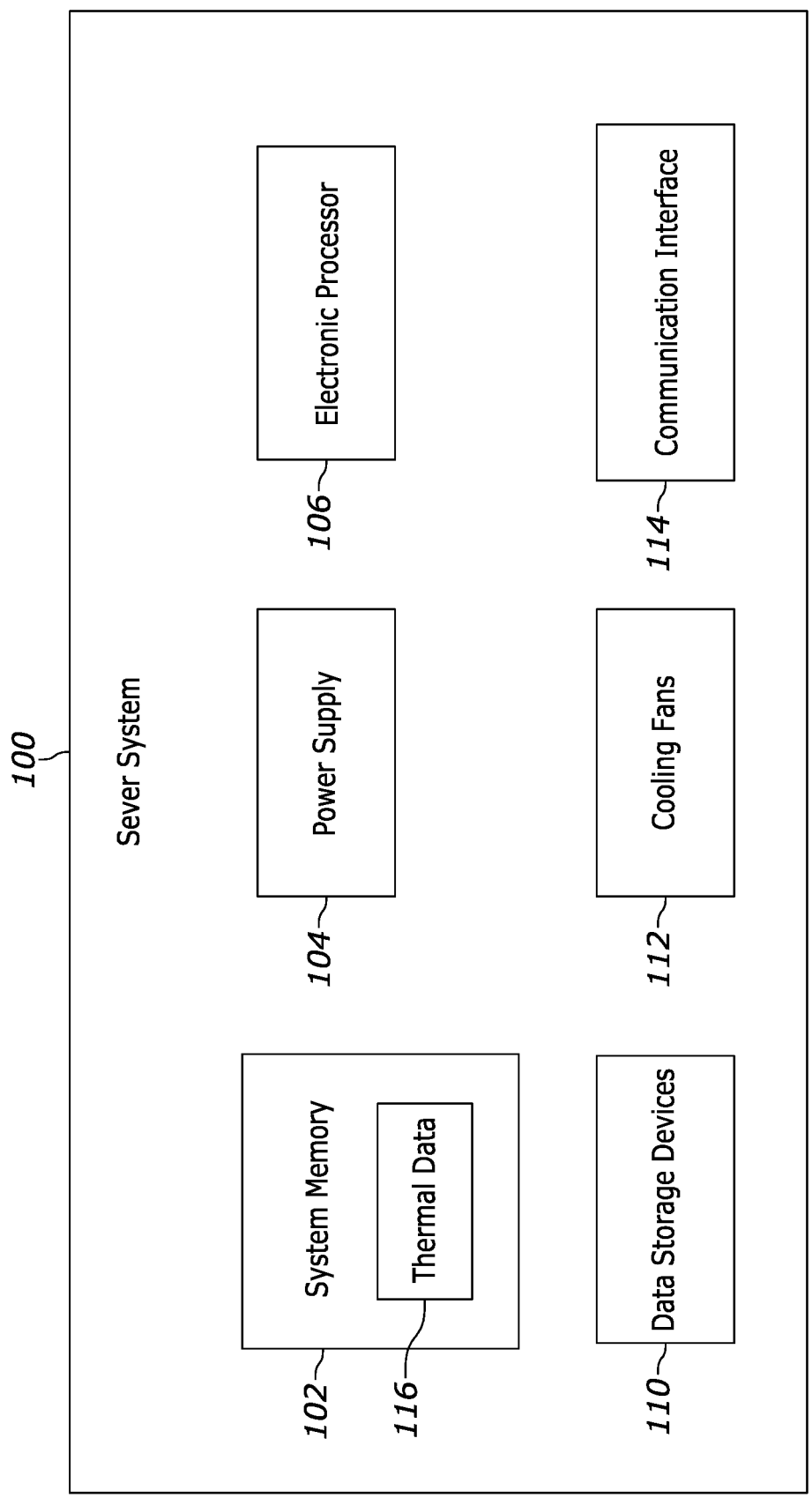
FIG. 1 illustrates a block diagram of a server, in accordance with various aspects of the present disclosure.

FIG. 1 is a block diagram of a server system 100, according to some embodiments. While the system 100 is described as a server system, it is understood that the system 100 may be an IMS system, or other system type which includes multiple data storage devices.

The server system 100 includes system memory 102, one or more power supplies 104, an electronic processor 106, a plurality of data storage devices 110, one or more cooling fans 112 for facilitating air flow in the server system 100, and a communication interface 114. The communication interface 114 may include one or more communication devices, such as network interface devices. In one example, various information may be provided to, or requested from the one or more data storage devices 110 via the communication interface 114. The request for retrieval of data from the data storage devices 110 and/or the storage of data to the data storage devices 110 may be processed by the one or more processors 106. Generally, the server system 100 works as a general server system as required for a given application.

The plurality of data storage devices 1110 are arranged in a chassis of the server system 100. In one embodiment, the plurality of data storage devices 110 are solid-state drives ("SSD"), such as non-volatile NAND SSDs. However, other SSD types are also contemplated. Additionally, in other examples, the plurality of data storage devices 110 may be other data storage devices, such as hard-disk drives ("HDD"). The cooling fans 112 are configured to direct air towards (e.g., push) the one or more data storage devices 110. However, in other examples, the cooling fans 112 may be configured to direct air away (e.g., pull) from the data storage devices 110, resulting in air flow being pulled across the data storage devices 110 in a direction away from the data storage devices 110.

The memory 102 may store thermal data 116 associated with the data storage devices 110. For example, the memory 102 may periodically receive, from each of the plurality of data storage devices 110, temperature information related to an internal temperature of the data storage device 200. The thermal data 116 may include information associated with an amount of data operations performed by the plurality of data storage devices 110. Alternatively, or in addition, the thermal data 116 may include information associated with an internal temperature of the plurality of data storage devices 110. The electronic processor 106 may control the cooling fans 112 based on the thermal data 116.

Figure 2:
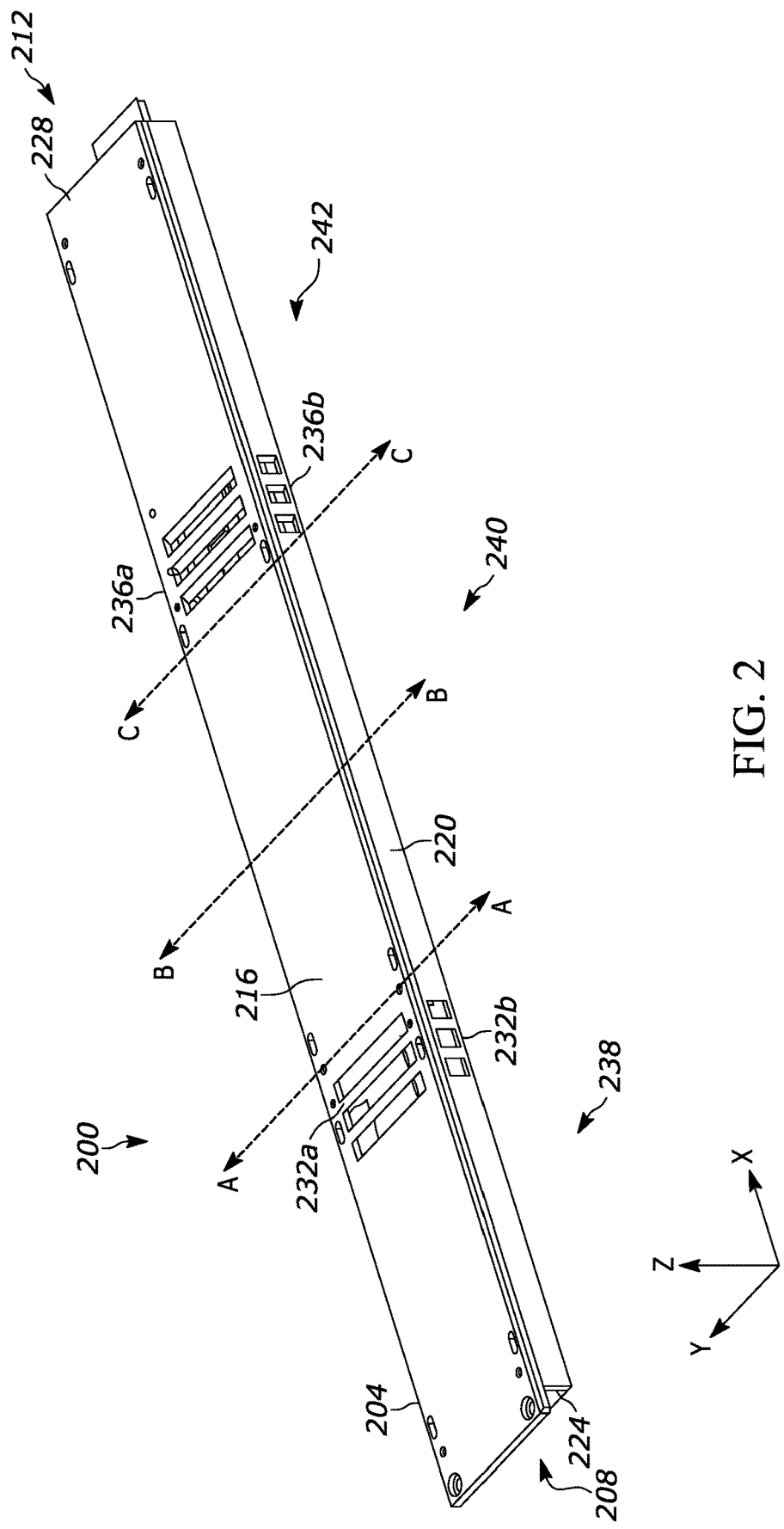
FIG. 2 illustrates a perspective view of a data storage device, in accordance with various aspects of the present disclosure.

FIG. 2 illustrates a perspective view of a data storage device 200, included, for example, in the plurality of data storage devices 110 of FIG. 1. The data storage device 200 includes a housing 204 having a first end surface 208 defining a first end of the housing 204 and a second end surface 212 opposite the first end surface 208 and defining a second end of the housing 204. The first end surface 208 is arranged in a first plane, and the second end surface 212 is arranged in a second plane. In some examples, the first plane and the second plane may be substantially parallel to one another. The housing 204 includes an upper surface 216 arranged in a third plane traversing the first plane and the second plane. In some examples, the third plane may be substantially orthogonal to the first plane and the second plane. The upper surface 26 extends between the first end surface 208 and the second end surface 212. The housing 204 also includes at least one side surface 220 arranged in a fourth plane substantially orthogonal to the upper surface 216 and either or both of the first end surface 208 and the second end surface 212. The housing 204 may also include a lower surface opposite the upper surface 216. The lower surface is arranged in a fifth plane traversing the first plane and the second plane. In some examples, the fifth plane is substantially parallel with the third plane.

The first end surface 208 includes at least one first aperture that defines a first airflow inlet 224. The first airflow inlet 224 is formed as an aperture in the first end surface 208 (e.g., a rectangular aperture, a square aperture, a circular aperture, or another shape). The first airflow inlet 224 receives airflow generated by the cooling fans 112 and directs the airflow through an interior of the housing 204. In some instances, the first airflow inlet 224 includes more than one airflow inlets. For example, the first airflow inlet 224 may be formed as a plurality of apertures.

The second end surface 212 includes at least one second aperture that defines a first airflow outlet 228. The first airflow outlet 228 is formed as an aperture in the second end surface 212 (e.g., a rectangular aperture, a square aperture, a circular aperture, or another shape). The first airflow outlet 228 directs airflow out of the interior of the housing 204. In some instances, the first airflow outlet 228 includes more than one airflow inlets. For example, the first airflow outlet 228 may be formed as a plurality of apertures.

The housing 204 includes at least one third aperture that defines a plurality of second airflow inlets or angled inlets 232. The angled inlets 232 include, for example, a first set of angled inlets 232a located on the upper surface 216 of the housing 204, and a second set of angled inlets 232b located on the at least one side surface 220. Like the first airflow inlet 224, the angled inlets 232 are operable to direct airflow generated by the cooling fans 112 through the interior of the housing 204. The plurality of angled inlets 232 are angled toward the interior of the housing 204 toward the second end of the housing 204. The plurality of angled inlets 232 have an angle between approximately fifteen degrees and approximately seventy-five degrees (e.g., thirty degrees, forty-five degrees, sixty degrees, etc.). The angle enables the plurality of angled inlets 232 to more efficiently direct air through the interior of the housing 204, and therefore more efficiently provide heat dissipation in the data storage device 200. For example, the angle of the plurality of angled inlets 232 enables air to enter the housing 204 at a higher speed and with less turbulence as compared with air entering a straight cut inlet at the upper surface 216 and/or the at least one side surface 220. The housing 204 may include more angled inlets than just the first set of angled inlets 232a. Alternatively, or in addition to the first set of angled inlets 232a, additional angled inlets may be disposed on other surfaces, for example, the lower surface of the housing 204.

The housing 204 also includes at least one fourth aperture that defines a plurality of second airflow outlets, or angled outlets 236. The angled outlets 236 include, for example, a first set of angled outlets 236a located on the upper surface 216 of the housing 204, and a second set of angled outlets 236b located on the at least one side surface 220. Like the first airflow outlet 228, the angled outlets 236 are operable to direct airflow out of the interior of the housing 204. The plurality of angled outlets 236 are angled toward the exterior of the housing 204 away from the first end of the housing 204. Like the plurality of angled inlets 232, the plurality of angled outlets 236 have an angle between approximately thirty degrees and approximately sixty degrees (e.g., thirty degrees, forty-five degrees, sixty degrees, etc.). The angle enables the plurality of angled outlets 236 to more efficiently direct air out of the interior of the housing 204, and therefore more efficiently provide heat dissipation in the data storage device 200. For example, the angle of the plurality of angled outlets 236 enables air to exit the housing 204 at a higher speed and with less turbulence as compared with air exiting a straight cut outlet at the upper surface 216 and/or the at least one side surface 220. The housing 204 may include more angled outlets than just the first set of angled outlets 236a. Alternatively, or in addition to the first set of angled outlets 236a, additional angled outlets may be disposed on other surfaces, for example, the lower surface of the housing 204.

The housing 204 further includes a first section 238, a second section 240, and a third section 242. The second section 240 is located between the first section 238 and the third section 242. In the illustrated example, the second section 240 is located approximately between section lines A-A and C-C.

Figure 3:
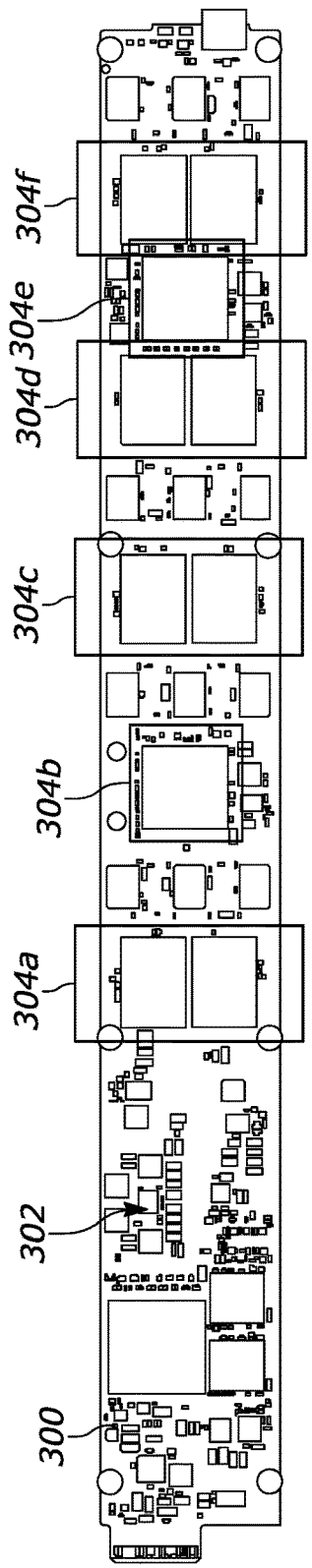
FIG. 3 illustrates a first example of a printed circuit board assembly included in a data storage device, in accordance with various aspects of the present disclosure.

The data storage device 200 includes a printed circuit board assembly ("PCBA") supported by the housing 204. FIG. 3 illustrates a conventional example of such a PCBA, for example PCBA 300. Conventional PCBAs such as PCBA 300 include a plurality of passive components 302 (e.g., resistors, capacitors, inductors, etc.) and a plurality of active components 304 (e.g., ball grid array ("BGA") packages). The plurality of active components 304 typically generate more heat than the plurality of passive components 302. Additionally, the passive components 302 are typically smaller than the active components 304. The larger size of the active components 304 relative to the passive components 302 increases air turbulence in the airflow path through the interior of the housing 204, thus reducing the efficiency of heat dissipation in the data storage device 200.

Airflow turbulence is further increased by the location of the plurality of active components 304 in the conventional PCBA 300. For example, the plurality of passive components 302 and the plurality of active components 304 are often randomly placed on the PCBA 300. As air flows through the interior of the housing 204 and experiences turbulence from the larger active components 304, the speed at which hot air, which has absorbed heat from the plurality of active components 304, exits the interior of the housing 204 decreases, trapping hot air inside the data storage device 200.

Figure 4:
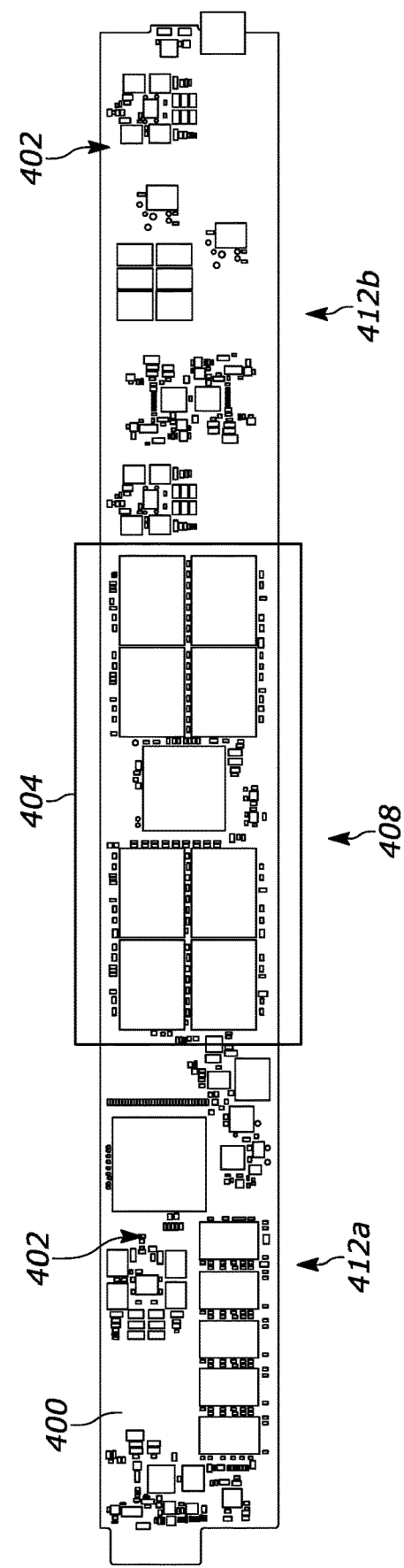
FIG. 4 illustrates a second example of a printed circuit board assembly included in a data storage device, in accordance with various aspects of the present disclosure.

Referring now to FIG. 4, a first modified PCBA 400 is illustrated. The first modified PCBA 400 includes a plurality of passive components 402 and a plurality of active components 404. The plurality of active components 404 are arranged in a central active component area 408 corresponding to the second section 240 of the housing 204. The plurality of passive components 402 are arranged in an outer passive component area 412 corresponding to the first section 238 and the second section 240 of the housing 204. For example, the passive component area 412 includes a first passive component area 412a and a second passive component area 412b, with the active component area 408 disposed therebetween.

The active component area 408 includes the majority of the active components included in the first modified PCBA 400. For example, the active component area 408 may include at least approximately 80% of the active components included in the first modified PCBA 400. Similarly, the passive component area 412 includes the majority of the passive components included in the first modified PCBA 400. For example, the passive component area 412 may include at least approximately 80% of the passive components included in the first modified PCBA 400. By providing the plurality of active components 404, each of which may have a more similar height relative to one another than to the plurality of passive components 402, in a single active component area 408, air turbulence within the active component area 408 may be reduced.

Figure 5:
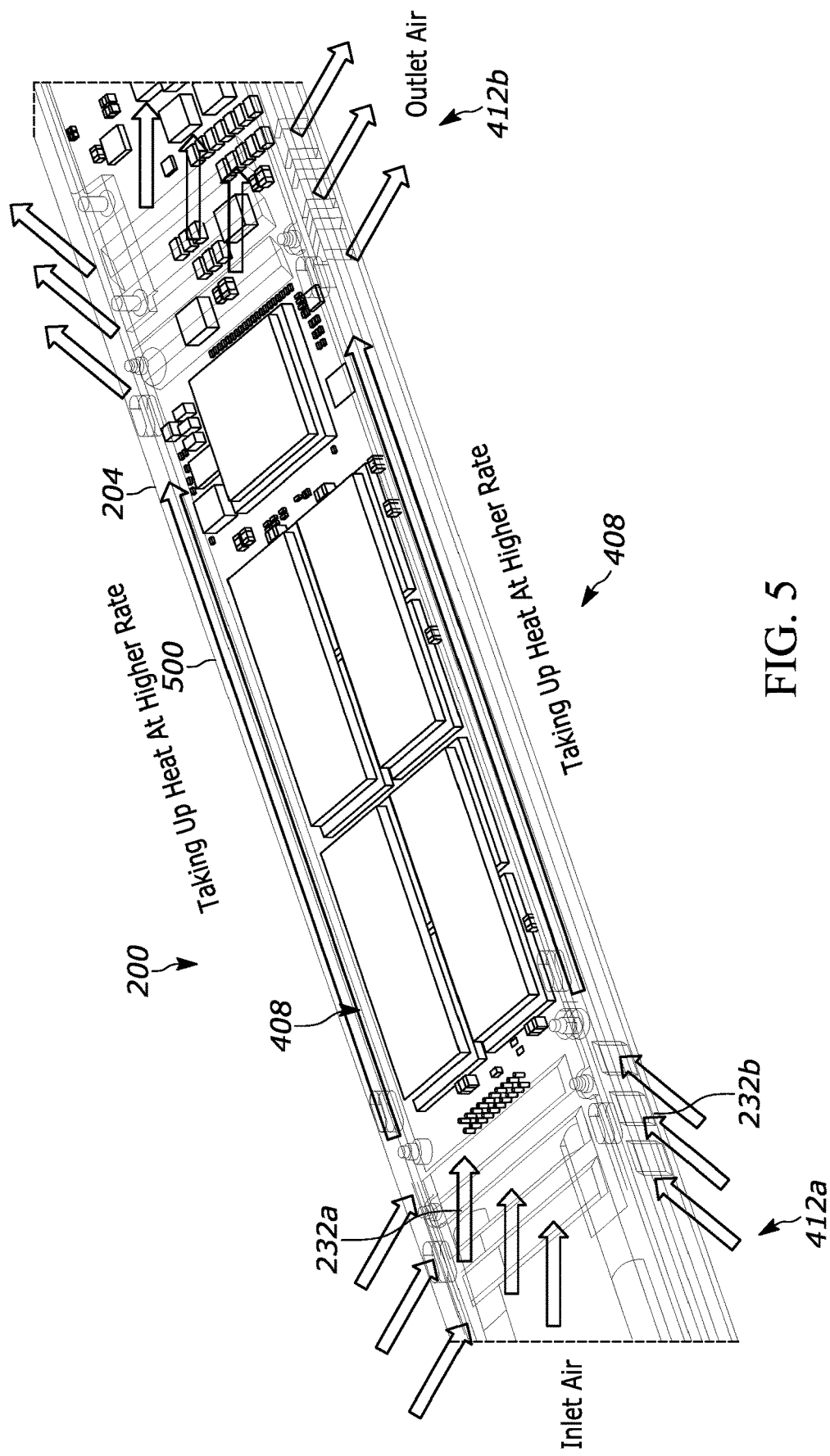
FIG. 5 illustrates a partial cutaway view of a data storage device, in accordance with various aspects of the present disclosure.

FIG. 5 illustrates a perspective view of a portion of the data storage device 200 including the first modified PCBA 400. As illustrated in FIG. 5, the plurality of angled inlets 232 are located on the first section 238 of the housing 204 approximately adjacent to a boundary between the first section 238 and the second section 240. The plurality of angled outlets 236 are located on the third section 242 of the housing 204 approximately adjacent to a boundary between the second section 240 and the third section. The locations of the plurality of angled inlets 232 and the plurality of angled outlets 236 proximate to the boundaries of the second section 240 enable a shorter airflow path (e.g., airflow path 500) through the active component area 408 than compared to the airflow path in a data storage device having only airflow inlets and outlets at either end of the data storage device 200 (e.g., the first airflow inlet 224 and the first airflow outlet 228 of FIG. 1). A shorter airflow path through the active component area 408, which includes the heat-generating plurality of active components 404, allows for a higher rate of circulation of air from the exterior of the housing 204 through the interior of the housing 204.

Figure 6:
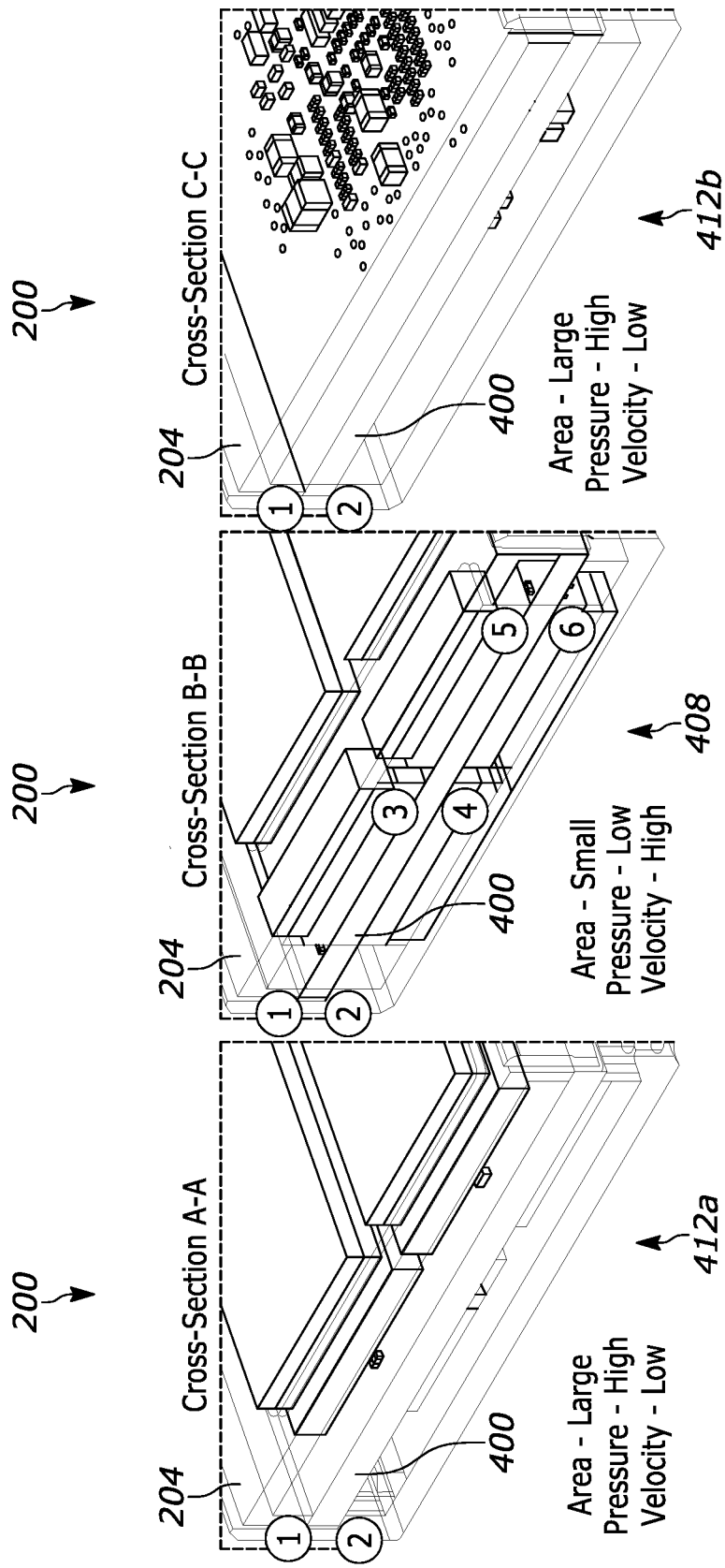
FIG. 6A illustrates a first cross-sectional view of a data storage device, in accordance with various aspects of the present disclosure.
FIG. 6B illustrates a second cross-sectional view of a data storage device, in accordance with various aspects of the present disclosure.
FIG. 6C illustrates a third cross-sectional view of a data storage device, in accordance with various aspects of the present disclosure.

FIG. 6A illustrates a cross-sectional view of the first passive component area 412a taken along cross-sectional line A-A of FIG. 2. FIG. 6B illustrates a cross-sectional view of the active component area 408 taken along cross-sectional line B-B of FIG. 2. FIG. 6C illustrates a cross-sectional view of the second passive component area 412b taken along cross-sectional line C-C of FIG. 2. As described above with respect to FIG. 4, the first passive component area 412a and the second passive component area 412b include the smaller, passive components of the first modified PCBA 400, while the active component area 408 includes larger, heat-generating components such as, for example, BGA packages. The active component area 408 is located in an area of the first modified PCBA 400 corresponding to the second section 240 of the housing 204. The first passive component area 412a is located in an area of the first modified PCBA 400 corresponding to the first section 238 of the housing 204. The second passive component area 412b is located in an area of the first modified PCBA 400 corresponding to the third section 242 of the housing 204. Therefore, as illustrated in FIGS. 6A-6C, a first cross-sectional area between the first modified PCBA 400 and the first section 238 is larger than a second cross-sectional area between the first modified PCBA 400 and second section 240. Similarly, a third cross-sectional area between the first modified PCBA 400 and the third section 242 is larger than the second cross-sectional area.

Air generated by the cooling fans 112 enters the first passive component area 412a, for example, via either or both of the first airflow inlet 224 and the angled inlets 232, is heated as it passes through the active component area 408, and flows into the second passive component area 412b before exiting through one or both of the first airflow outlet 228 and the angled outlets 236. The air experiences a higher pressure as it travels through the first passive component area 412a and the second passive component area 412b relative to a lower pressure as it travels through the active component area 408 because the second cross-sectional area is smaller than the first cross-sectional area and the third cross-sectional area. The higher pressure in the active component area 408 causes the air to flow through the active component area 408 at a higher speed relative to that of the first passive component area 412a or the second passive component area 412b. For example, the air may flow through the active component area 408 at a rate that is greater than or equal to approximately 295 linear feet per minute ("LFM"). The heated air particles are then pulled from the interior of the housing 204 through the angled outlet 236 located adjacent to the boundary of the second section 240 and the third section 242. Enabling air to flow through the active component area 408, which is populated with the heat-generating components of the first modified PCBA 400, at a faster rate further improves heat transfer efficiency in the data storage device 200.

In some instances, each of the plurality of passive components 402 are arranged in the first passive component area 412a and the second passive component area 412b such that the plurality of passive components 402 defines an airflow channel, or airflow highway, through an approximate center of each of the first passive component area 412a and the second passive component area 412b, therefore further reducing air turbulence in the interior of the housing 204. For example, the plurality of passive components may be arranged adjacent to an airflow channel extending along the approximate center of the first modified PCBA.

Figure 7:
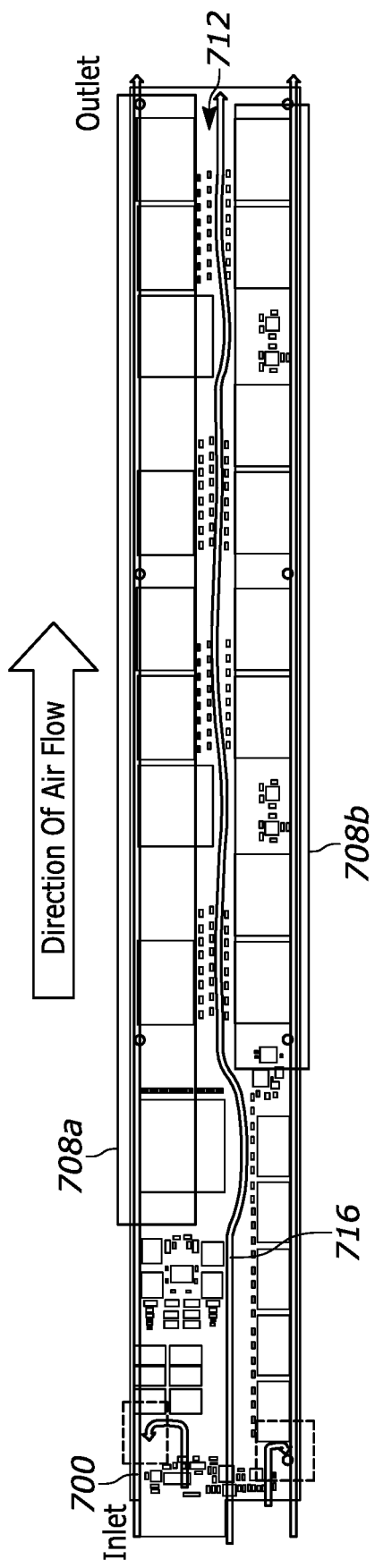
FIG. 7 illustrates a third example of a printed circuit board assembly included in a data storage device, in accordance with various aspects of the present disclosure.

Referring now to FIG. 7, a second modified PCBA 700 is illustrated. The second modified PCBA 700 may be disposed in the housing 204 of the data storage device 200 alternative to the first modified PCBA 400. The second modified PCBA 700 includes a plurality of active components arranged in a first active component area 708a and a second active component area 708b. The second modified PCBA 700 also includes a plurality of passive components arranged in a passive component area 712.

The first active component area 708a and the second active component area 708b include the majority of the active components included in the first modified PCBA 400. For example, the first active component area 708a and the second active component area 708b may include at least approximately 80% of the active components included in the second modified PCBA 700. Similarly, the passive component area 712 includes the majority of the passive components included in the second modified PCBA 700. For example, the passive component area 712 may include at least approximately 80% of the passive components included in the second modified PCBA 700.

The passive component area 712 is located between the first active component area 708a and the second active component area 708b in a direction approximately perpendicular to an airflow direction through the interior of the housing 204. For example, the passive component area 712 extends through the data storage device 200 in a longitudinal direction from the first end of the data storage device 200 to the second end of the data storage device 200, and the passive component area 712 is located between the first active component area 708a and the second active component area 708b in a lateral direction.

A cross-sectional area between the second modified PCBA 700 and the housing 204 in the first active component area 708a and the second active component area 708b is smaller than a cross-sectional area between the second modified PCBA 700 and the housing 204 in the passive component area 712. The passive component area 412 therefore forms an airflow channel 716, or highway, for directing air particles through the interior of the housing 204 while reducing the amount of turbulence in the airflow channel 716.

It is to be understood that the above description is intended to be illustrative and not restrictive. Many embodiments and applications other than the examples provide would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separately claimed subject matter.

What is claimed is:

1. A data storage device comprising: a housing including a first section, a second section, a third section, at least one first aperture that defines an airflow inlet, and at least one second aperture that defines an airflow outlet, and a printed circuit board assembly ("PCBA") disposed in the housing, the PCBA including a plurality of active components arranged in a first area corresponding to the second section and a plurality of passive components arranged a second area and a third area corresponding to the first section and the third section, respectively, wherein the airflow inlet and the airflow outlet direct airflow through an airflow channel in the second section of the housing, and wherein the airflow channel has a first cross-sectional area between the PCBA and the second section of the housing and a second cross-sectional area between the PCBA and the first section of the housing, the first cross-sectional area is larger than the second cross-sectional area.

2. The data storage device of claim 1, wherein
the airflow channel has a third cross-sectional area between the PCBA and the third section of the housing, wherein the second cross-sectional area is larger than the third cross-sectional area.

3. The data storage device of claim 1, wherein
the second section is located between the first section and the third section in a direction substantially perpendicular to an airflow direction, such that the airflow channel extends along an approximate center of the PCBA in the airflow direction.

4. The data storage device of claim 1, wherein
the housing includes a first end and a second end opposite the first end,
the airflow inlet is located at the first end, and
the airflow outlet is located at the second end.

5. The data storage device of claim 1, wherein all passive components of the PCBA are strictly arranged in the second and third area on one or both of an upper surface of the PCBA and a lower surface of the PCBA.

6. A data storage device, comprising:
a housing including a first section, a second section, a third section, a first aperture that defines an angled airflow inlet, and a second aperture that defines an angled airflow outlet, the first aperture positioned between the first section and the second section, and the second aperture positioned between the second section and the third section,
the angled airflow inlet and the angled airflow outlet configured to direct airflow through the second section of the housing;
a printed circuit board assembly ("PCBA") disposed in the housing, the PCBA including a plurality of active components arranged in a first area corresponding to the second section and a plurality of passive components arranged in a second area and a third area corresponding to the first section and the third section, respectively; and
a second airflow inlet and a second airflow outlet together configured to direct airflow through an airflow channel in the first section, the second section, and third section of the housing, wherein each of the plurality of passive components are arranged adjacent to the airflow channel.

7. The data storage device of claim 6, wherein the airflow channel extends along an approximate center of the PCBA in an airflow direction.

8. The data storage device of claim 6, wherein the airflow channel has a first cross-sectional area between the PCBA and the first section, a second cross-sectional area between the PCBA and the second section, and a third cross-sectional area between the PCBA and the third section, wherein the first cross-sectional area is larger than the second cross-sectional area, and the third cross-sectional area is larger than the second cross-sectional area.

9. The data storage device of claim 6, wherein
the second section is located between the first section and the third section in an airflow direction.

10. The data storage device of claim 6, wherein the plurality of active components are approximately 80% of all active components within the housing, and wherein the plurality of passive components is all passive components within the housing.

11. The data storage device of claim 6, wherein
the angled airflow inlet is located approximately adjacent to a boundary between the first section and the second section, and
the angled airflow outlet is located approximately adjacent to boundary between the second section and the third section.

12. The data storage device of claim 6, wherein
an angle of the angled airflow inlet is between approximately 15 degrees and approximately 75 degrees, and
an angle of the angled airflow outlet is between approximately 15 degrees and approximately 75 degrees.

13. The data storage device of claim 6, wherein
the housing includes a first surface along a first plane and a second surface along a second plane that traverses the first plane,
the angled airflow inlet includes a first angled airflow inlet located on the first surface and a second angled airflow inlet located on the second surface, and
the angled airflow outlet includes a first airflow outlet located on the first surface and a second angled airflow outlet located on the second surface.

14. A data storage device comprising:
a housing including a first section, a second section, a third section, at least one first aperture that defines an angled airflow inlet, and at least one second aperture that defines an angled airflow outlet, and
a printed circuit board assembly ("PCBA") disposed in the housing, the PCBA including a plurality of active components arranged in a first area corresponding to the second section and a plurality of passive components arranged a second area and a third area corresponding to the first section and the third section, respectively,
wherein the angled airflow inlet and the angled airflow outlet direct airflow through the second section of the housing, and
wherein a first cross-sectional area between the PCBA and the first section is larger than a second cross-sectional area between the PCBA and the second section.

15. The data storage device of claim 14, wherein
a third cross-sectional area between the PCBA and the third section is larger than the second cross-sectional area.

16. The data storage device of claim 14, wherein
the second section is located between the first section and the third section in an airflow direction.

17. The data storage device of claim 14, wherein
the angled airflow inlet is located approximately adjacent to a boundary between the first section and the second section, and
the angled airflow outlet is located approximately adjacent to boundary between the second section and the third section.

18. The data storage device of claim 14, wherein
an angle of the angled airflow inlet is between approximately 15 degrees and approximately 75 degrees, and
an angle of the angled airflow outlet is between approximately 15 degrees and approximately 75 degrees.

19. The data storage device of claim 14, wherein
the housing includes a first surface along a first plane and a second surface along a second plane that traverses the first plane,
the angled airflow inlet includes a first angled airflow inlet located on the first surface and a second angled airflow inlet located on the second surface, and
the angled airflow outlet includes a first airflow outlet located on the first surface and a second angled airflow outlet located on the second surface.

20. The data storage device of claim 19, wherein
the housing includes a third surface traversing the first surface and the second surface, the third surface defining a first end of the housing and a fourth surface traversing the first surface and the second surface, the third surface defining a second end of the housing opposite the first end,
the third surface includes at least one third aperture that defines an airflow inlet,
and the fourth surface includes at least one fourth aperture that defines an airflow outlet.

* * * * *